United States Patent [19]
Wan et al.

[11] Patent Number: 5,599,733
[45] Date of Patent: Feb. 4, 1997

[54] METHOD USING CADMIUM-RICH CDTE FOR LOWERING THE METAL VACANCY CONCENTRATIONS OF HGCDTE SURFACES

[75] Inventors: Chang-Feng Wan, Dallas; John H. Tregilgas, Richardson, both of Tex.

[73] Assignee: Texas Instruments Incorporated, Dallas, Tex.

[21] Appl. No.: 342,530

[22] Filed: Nov. 21, 1994

Related U.S. Application Data

[63] Continuation of Ser. No. 137,874, Oct. 15, 1993, abandoned.
[51] Int. Cl.$^6$ .................................................. H01L 21/225
[52] U.S. Cl. .............................. 437/160; 437/5; 437/987; 437/247
[58] Field of Search ........................... 437/5, 160, 64, 437/987, 247, 248

[56] References Cited

U.S. PATENT DOCUMENTS 4,927,773  5/1990  Jack et al. .
4,950,615  8/1990  Basol et al. .

*Primary Examiner*—Tom Thomas
*Assistant Examiner*—Lynne A. Gurley
*Attorney, Agent, or Firm*—Kay Houston; James Brady; Richard L. Donaldson

[57] ABSTRACT

A hybrid focal plane array has p-n junction photodiodes formed in a substrate (10) of HgCdTe which is passivated by a cap layer (12) of Cd-rich CdTe. The active surface of the HgCdTe substrate is passivated by annealing at a temperature sufficient to support interdiffusion between the Cd-rich CdTe capping layer (12) and the HgCdTe substrate (10). Use of the CdTe capping layer (12) with a slight excess Cd maintains the surface of the HgCdTe substrate (10) in a metal-rich phase condition.

15 Claims, 4 Drawing Sheets

CAP

ANNEAL

CAP

ANNEAL

HYBRIDIZE

IMPLANT

METHOD USING CADMIUM-RICH CDTE FOR LOWERING THE METAL VACANCY CONCENTRATIONS OF HGCDTE SURFACES

This is a continuation of application Ser. No. 08/137,874, filed Oct. 15, 1993, now abandoned.

TECHNICAL FIELD OF THE INVENTION

This invention relates generally to passivation of semiconductor substrates, and in particular to a method for passivating the active surface of an intrinsically doped n-type or p-type substrate of mercury cadmium telluride (HgCdTe), for improving minority carrier lifetimes and reducing interfacial defects.

BACKGROUND OF THE INVENTION

Semiconductors having elements from Group II and Group VI of the periodic table, such as mercury cadmium telluride, have been used in the fabrication of infrared radiation detectors and imagers which operate in the lower infrared frequency band down to the limits of the available long wave length atmospheric window, i.e., at wavelengths of 8–12 microns. The detection of such long wavelength radiation, if it is to be done using a detector at only moderate cryogenic temperatures, e.g. at liquid nitrogen rather than liquid helium temperatures, is preferably done using a very narrow bandgap semiconductor, such as $Hg_{1-x}Cd_xTe$.

Since HgTe is a semimetal having a very small bandgap of about −0.3 eV, and CdTe has a bandgap of about +1.6 eV, compositions having a small and arbitrarily selectable bandgap may be specified simply by varying the proportions of an alloy having the composition $Hg_{1-x}Cd_xTe$. Such alloys are here referred to generically as "HgCdTe". For example, for x=0.22 the composition $Hg_{0.78}Cd_{0.22}Te$ has a cutoff of about 10 microns, that is, a composition having a bandgap approximately equal to the photon energy of infrared light having a wavelength of 10 microns. By increasing the percentage of cadmium, compositions having a larger bandgap, and therefore a shorter operating wavelength, may be produced. For example, the selection of x=0.3 yields the composition $Hg_{0.7}Cd_{0.3}Te$ having a bandgap of about 0.24 eV which corresponds to a photon wavelength of 5 microns (at 77° K.).

DESCRIPTION OF THE PRIOR ART

In conventional methods for forming optical detector arrays, heterojunction photodiodes have been used as optical detectors and have been interconnected with various forms of image processing circuitry. In the formation of such arrays, large numbers of n-p or p-n junctions are produced by forming receptor regions in the active surface of an HgCdTe substrate. The diodes, each formed at a junction of n-type and p-type semiconductor material, form individual photodetectors, and each photodetector defines a pixel within the photodetector array.

In the formation of such detectors, it is important that the receptor regions are precisely formed so that the resulting photodetectors have low leakage currents, high dynamic resistance and low crosstalk so that they may be closely spaced to enhance the resolution of the resulting photodetector array. Such photodetector structures may be formed of bodies or wafers including compounds of the Group II and Group VI elemental groups of the periodic table, such as HgCdTe, and may include a protective layer such as cadmium telluride (CdTe) deposited on the HgCdTe wafer to act as a passivation layer, antireflective coating and an insulator for conductive interconnect lines. A photoresist pattern is typically formed above the passivation/insulation layer, the photoresist pattern having multiple diffusion window openings mutually spaced in accordance with the desired photodetector array pattern, and in accordance with the resolution desired.

Photodiode junctions have been formed in vacancy doped p-HgCdTe by implantation damage through photographically defined windows into the p-type HgCdTe material, or by converting a thin layer of the p-type HgCdTe material into n-type by appropriate annealing in a saturated Hg atmosphere. At the appropriate annealing temperature, Hg will diffuse through the windows into the substrate and thereby reduce the concentration of metal vacancy acceptor sites in the substrate beneath the windows. Consequently, a surface region of the HgCdTe substrate will convert from p-type to n-type during mercury indiffusion if the impurity donor concentration exceeds the impurity acceptor concentration of the substrate and if the indiffusion temperature and anneal time are chosen to reduce the metal vacancy acceptor concentration below the critical level, fewer than $10^{15}$ carriers/cm$^3$ and preferably approaching $10^{14}$ carriers/cm$^3$.

P-type on n-type heterostructures are composed of an n-type HgCdTe base-layer which is capped with a p-type (arsenic-doped) capping layer which may have a wider bandgap compared to the underlying HgCdTe. After growth of these layers they must be annealed in an Hg ambient to activate the arsenic and to reduce the metal vacancy concentration in the n-type layer. Mesa structures may then be used to delineate the p-n junctions. Passivation of the exposed p-type and n-type surfaces is desirable to reduce surface recombination.

Passivation of $Hg_{1-x}Cd_xTe$ during detector fabrication is used to reduce dark currents arising from surface states. Dangling bonds at surfaces can contribute to surface states which affect the electrical characteristics of the detectors, for example, the photocarrier lifetimes and surface recombination velocity. Analogous passivation of silicon for integrated circuits fabrication is typically achieved by growth of thermal oxides at temperatures about 1,000° C.; however, thermal growth of oxides on $Hg_{1-x}Cd_xTe$ is not feasible due to the out diffusion of mercury at even moderate temperatures. Consequently, passivation of $Hg_{1-x}Cd_xTe$ by deposition of zinc sulfide or silicon dioxide has been used, but such passivation yields detectors that degrade (surface state density and accumulated surface charge vary and give unstable device characteristics) when subjected to temperatures over 70° C.

An improvement is passivation by anodic oxide, for example oxides of mercury, cadmium and tellurium which may be grown on the surface of $Hg_{1-x}Cd_xTe$ electrochemically in a KOH solution. Anodic oxide is also temperature sensitive and yields detectors that degrade at about 80° C. Further, even extended storage at room temperature degrades such detectors. Thus, it is desirable to provide a passivation for $Hg_{1-x}Cd_xTe$ that avoids detector degradation at temperatures somewhat above room temperature.

Capping HgCdTe surfaces with ZnS prior to vacuum annealing has been used during vacuum annealing to prevent surface degradation, but ZnS is considered to be a diffusion barrier for Hg and can retard vacancy formation.

Interdiffused CdTe capping layers on HgCdTe surfaces have proven to be useful for improving device performance, but important properties such as carrier density and minority carrier lifetime (MCL) in the HgCdTe layer can change during the interdiffusion anneal. Loss of Hg from the HgCdTe substrate during CdTe interdiffusion increases the metal vacancy concentration and converts n-type HgCdTe layers to p-type. The degree of p-type doping is proportional to the anneal temperature. Vacuum or inert gas annealing at 250° C. to 400° C. for an hour or more produces acceptor densities in the range of about $1\times10^{16}$/cc to $4\times10^{17}$/cc. The minority carier lifetimes (MCL) in the p-type HgCdTe substrate are significantly reduced after such anneal. Interdiffusion of CdTe on n-type HgCdTe surfaces under these conditions converts the n-type HgCdTe to p-type, even when annealed in a saturated Hg environment.

SUMMARY OF THE INVENTION

According to the present invention, the active surface of an HgCdTe substrate is passivated by capping the substrate with a layer of cadmium-rich CdTe and thereafter annealing the capped substrate at a temperature which is sufficient to support interdiffusion between the Cd-rich CdTe layer and the HgCdTe substrate. Further, according to the present invention, there is provided a method for passivating a p-type or n-type substrate of HgCdTe where a lower metal vacancy concentration is desired, for example in heterojunctions or in extrinsically doped p-type material. The Cd-rich CdTe passivation layer induces diffusion of Hg interstitials, which lowers the metal vacancy concentration in the surrounding material. This allows longer minority carrier lifetimes (MCL) to be achieved, and may suppress undesirable Kirkendal effects at the interface. It also compensates for the loss of metal interstitials which may occur during interdiffusion.

TECHNICAL ADVANTAGES

The present invention provides several technical advantages over prior techniques for forming photodiodes. Cd-rich CdTe passivation allows interdiffusion of the CdTe/HgCdTe interface while limiting metal vacancy concentration. As a result, this will prevent conversion of n-type material to p-type material. This is important for double layer heterostructures where a lightly doped n-type (1E15/cc range) HgCdTe is passivated with interdiffused CdTe. (Te-rich passivation will convert the n-type layer to p-type).

One important technical advantage over prior techniques is that it is useful for passivating as-grown and annealed p-on-n heterostructures (i.e. arsenic-doped p-type HgCdTe on n-type HgCdTe).

A related technical advantage provided by Cd-rich CdTe passivation is that it supplies excess Cd interstitials which helps reduce metal vacancies in the HgCdTe during annealing. Consequently, it may be used to type convert intrinsic p-type material to n-type by vacancy reduction (i.e. during interdiffusion at about 250° C.). It insures an absence of second-phase Te in the CdTe films which can produce high vacancy concentrations.

Another technical advantage is that cadmium-rich CdTe passivation can be used for producing p-type intrisically doped material with higher minority carrier lifetimes (MCL). In this case, the passivated substrate is annealed at about 250° C. or higher, to produce acceptor concentrations of from about 5E15/cc to about 5E16/cc and may be used for implanted diodes.

Yet another technical advantage over the prior technique is that it can be used to passivate extrinsically doped p-type HgCdTe to limit the amount of metal vacancies present in the substrate since they are known to be recombination centers.

A further technical advantage provided by the method of the present invention is that the cadmium-rich CdTe cap serves as a barrier which retards alteration of the metal vacancy acceptor concentration in the HgCdTe substrate as it is cooled.

Another technical advantage in using the Cd-saturated CdTe cap layer is that it may suppress the Kirkendal effect so that the interfacial defects will not migrate from the interface to the narrow bandgap HgCdTe region where they might contribute to excess dark current.

BRIEF DESCRIPTION OF THE DRAWINGS

For a more complete understanding of the present invention, and the advantages thereof, reference is now made to the following specification and accompanying drawings, in which.

DETAILED DESCRIPTION OF THE INVENTION

The present invention permits reliable annealing of HgCdTe to produce low metal vacancy HgCdTe.

As used herein, "Cd-rich" and "excess Cd" mean the presence of cadmium in a mole fraction which exceeds the amount of cadmium found in the stoichiometric solid phase of $Cd_xTe_{1-x}$, where x=0.5. When x>0.5, excess Cd is present in the solid phase of Cd-rich $Cd_xTe_{1-x}$, so that the Cd/Te ratio exceeds 1.0. For x>>0.5, second-phase Cd may be present. For x<0.5, excess Te is present.

As used herein, "low metal vacancy" material refers to either n-type material or lightly doped p-type material, where $p<5\times10^{15}$ metal vacancies.

As used herein, the "Kirkendal effect" is defined as interdiffusion between dissimilar materials where displacement of the interface is caused by a net flux of atoms across the interface due to differences in the diffusivities of diffusing species relative to one another.

Figure 1:
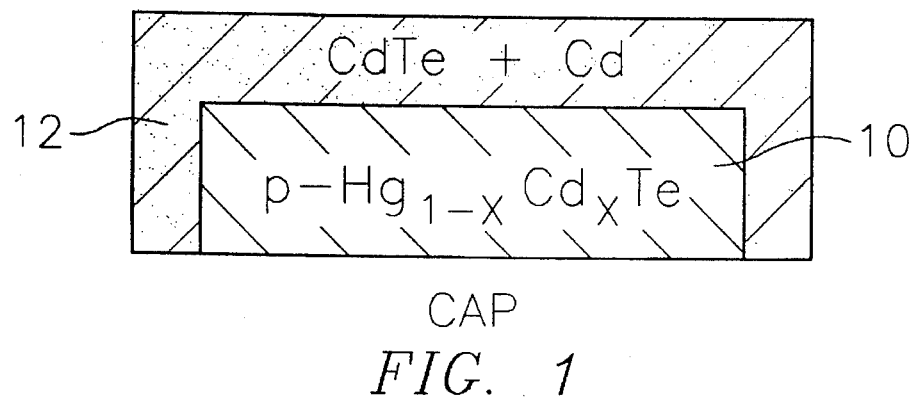
FIG. 1 is a simplified diagram which shows an p-type HgCdTe substrate encapsulated within a Cd-rich CdTe cap layer.
Figure 2:
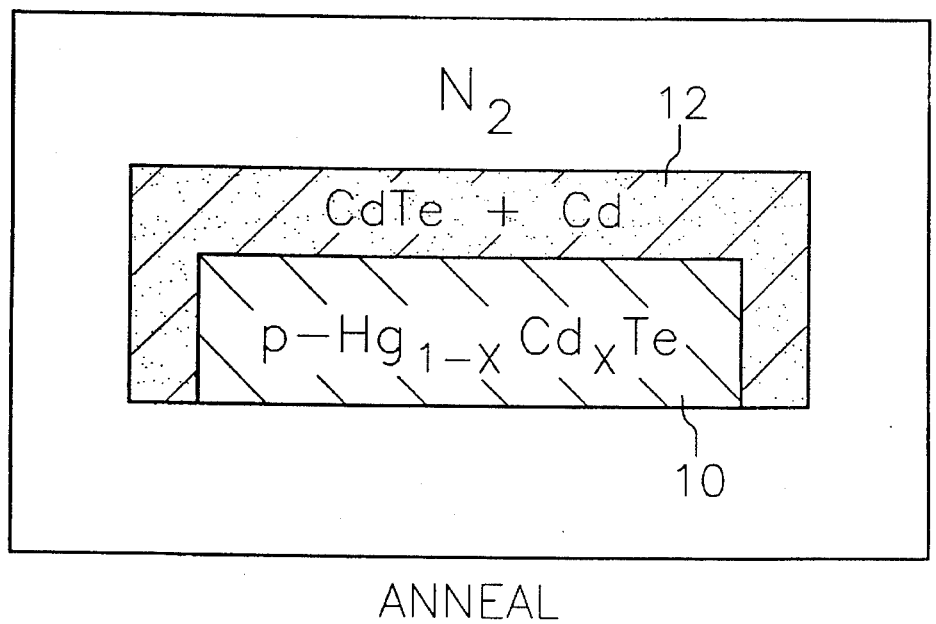
FIG. 2 is a simplified schematic diagram which illustrates an annealing step.

Referring initially to FIG. 1, a substrate 10 of $Hg_{1-x}Cd_xTe$ is loaded within a reactor chamber (not shown) for receiving a cap layer 12 of cadmium-rich cadmium telluride. Preferably, the cap layer 12 is deposited by evaporation or sputtering of CdTe from a first source and Cd from a second source to yield a film of CdTe plus excess Cd, with the excess Cd being present in the film in an amount of from about 0.001 percent to about fifty percent. Other methods for depositing the passivation cap layer 12 may be utilized such as by sputtering Cd and/or CdTe to yield CdTe plus excess Cd, by hot-wall epitaxy (HWE), molecular beam epitaxy (MBE) and MOCVD. Preferably, the substrate 10 is p-type HgCdTe having a donor concentration in the range of from $1\times10^{14}$–$5\times10^{15}$/cc.

Figure 6:
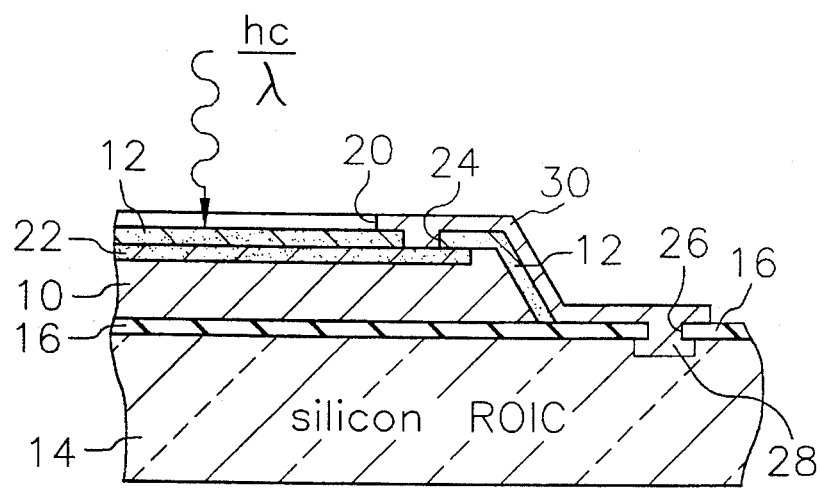
FIG. 6 is a magnified cross-sectional view of a hybrid focal plane array in which the $Hg_{1-x}Cd_xTe$ junction photodiodes of FIG. 4 are mounted on the input stage of a silicon read out integrated circuit.

In the embodiment of the method illustrated in FIGS. 1–4, a vertically integrated photodiode is formed, in association with several other similar photodiodes (not shown), which are mutually and laterally spaced on either side of the illustrated portion of the diode structure (see FIG. 6). Each photodiode corresponds to a single pixel of the photodiode array.

Referring again to FIG. 1, the substrate 10 is a planar slice of vacancy doped semiconductor material having elements from the low metal vacancy Group II–Group VI elemental groups of the periodic table. The semiconductor material consists substantially of a II–VI or a II–IV–VI compound semiconductor selected from the group consisting of mercury cadmium telluride (HgCdTe), mercury manganese telluride (HgMnTe), or mercury zinc telluride (HgZnTe). The cap layer 12 of cadmium-rich CdTe is deposited on the upper and side surfaces of the substrate 10. After the low metal vacancy substrate 10 has been capped, it is placed in an annealing oven to set the metal vacancy acceptor concentration within the HgCdTe slice.

Prior to applying the cadmium-rich CdTe cap layer, the mercury cadmium telluride surface is polished. Thereafter, the cadmium-rich CdTe material is deposited in a layer about 2000 Å thick.

Various annealing temperatures and annealing times may be used. For example, at 250° C., the annealing time is one hour to more than one day, and for an annealing temperature of 440° C., the annealing time is one-half hour or more. The anneal is performed preferably in an $N_2$ atmosphere, or in the presence of some other non-oxidizing atmosphere, or in a vacuum.

Figure 7:
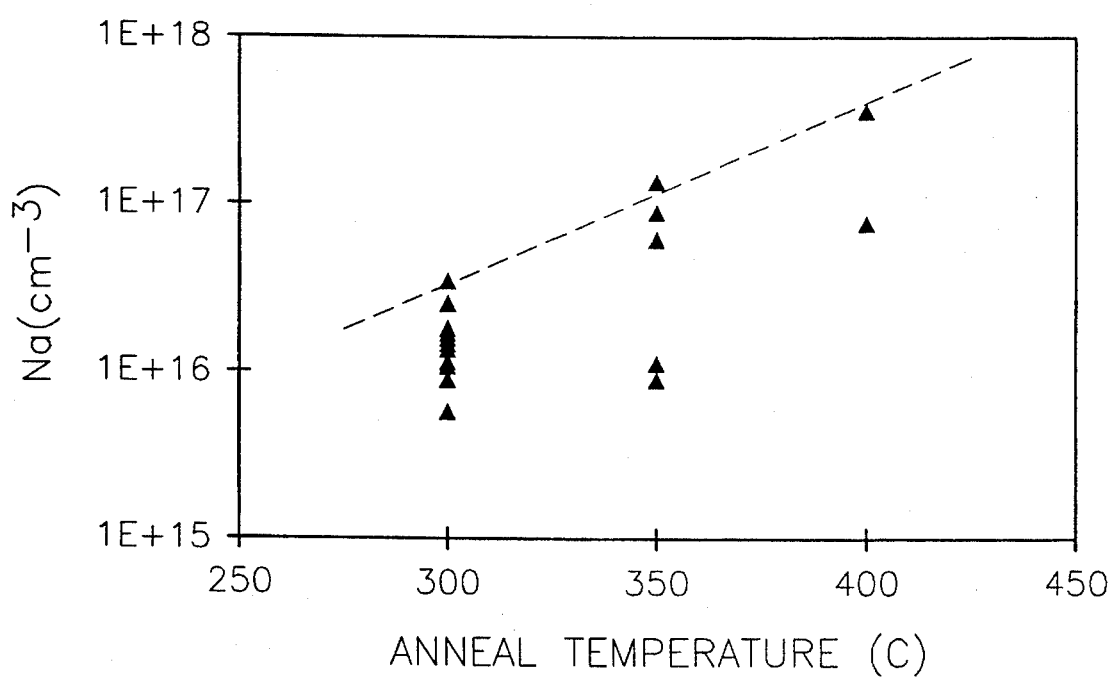
FIG. 7 illustrates carrier concentration as a function of anneal temperature for an LPE HgCdTe substrate passivated with cadmium-rich CdTe.

The net acceptor densities in the HgCdTe substrate 10 for three different anneal temperatures are illustrated in FIG. 7. The net acceptor concentration $N_a$ of vacancy-doped samples in general fell below a limit established for LPE annealed with Te-rich CdTe caps, shown as the dashed line in FIG. 7. The variation in $N_a$ was probably due to difference in reaction rate and Cd activity. The minority carrier lifetime (MCL) monotonically tracked p-type carrier concentration (FIG. 8) and was comparable to LPE annealed in Hg-saturated ambient.

Figure 8:
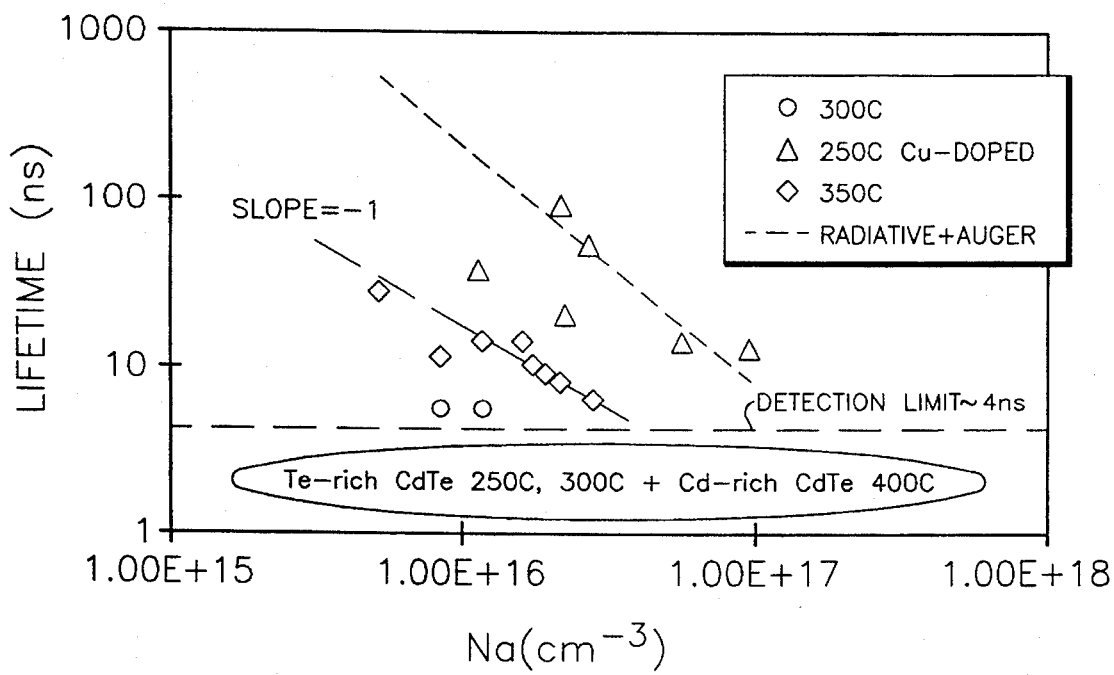
FIG. 8 illustrates the lifetime values as a function of carrier concentration of annealed samples.

As shown in FIG. 8, the lifetime for 350° C. annealed samples fell to a much lower lifetime-vs-carrier concentration line. 400° C. samples could not be measured as the lifetimes were too short. For LPE samples annealed under regular Te-rich CdTe at 250° C. or 300° C., the lifetimes still could not be measured, indicating that they were very short. Some samples were checked for surface effects; their CdTe cap layer was stripped along with ~5 to 10 μm of LPE and passivated with ZnS. The results did not change significantly showing that changes occurred in the LPE material itself, not at the surface.

Samples annealed at 250° C. or lower with Cd-enriched CdTe can become n-type in contrast to p-type conductivity obtained by annealing samples with regular Te-rich CdTe at the same temperature. Lifetime in these n-LPE layers was ~1.5 μs. Cu-doped samples annealed at 250° C. under Te-rich CdTe remained p-type and exhibited very long lifetimes that approached radiative limits (FIG. 8). When the 350° C. or 400° C. annealed samples were annealed again at a lower temperature between 200° and 250° C., the $N_a$ values relaxed to lower levels. The resultant $N_a$ values were comparable to values for bulk HgCdTe samples annealed under excess Te. The minority-carrier lifetimes were longer as expected for lower $N_a$ material. The degradation in lifetime due to annealing under excess Te instead of excess Hg indicates there is a defect mechanism that is caused by excessive loss of Hg during anneal. This relaxation anneal may be used to lower carrier concentrations after a high temperature anneal to more desirable levels.

In addition, the diodes made by ion implantation on Cd-rich CdTe passivated HgCdTe surfaces showed long diffusion length, which is consistent with the above measurements.

Figure 5:
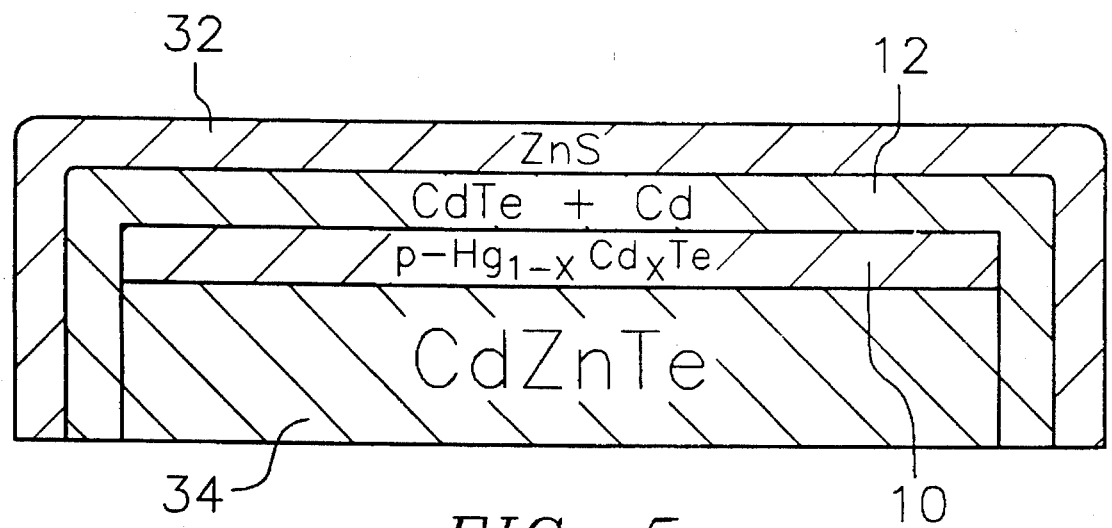
FIG. 5 is a view similar to FIG. 1 which illustrates an alternative substrate arrangement in which the p-type HgCdTe is grown by liquid phase epitaxy (LPE) on a CdZnTe substrate, and capped by cadmium-rich CdTe and ZnS.

Optionally, thin capping layers (less than 3000 angstroms) are topped with 3000–4000 angstroms of ZnS prior to annealing, as shown in FIG. 5. Vacancy carrier concentrations within the HgCdTe substrate 10 are controlled by the final annealing temperature and duration.

Figure 3:
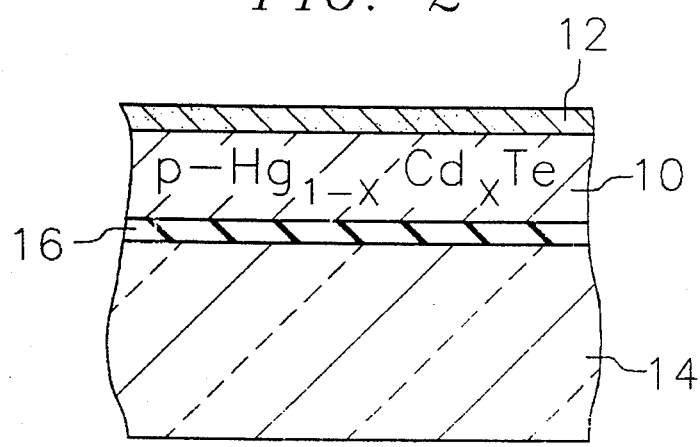
FIG. 3 is a magnified cross-sectional view of the capped substrate which has been annealed and epoxy hybridized to a read out integrated circuit (ROIC) chip.

Referring now to FIG. 3, the substrate 10 and cap layer 12 are epoxy hybridized to a read out integrated circuit (ROIC), thinned to reduce the overall thickness of the HgCdTe and CdTe passivation cap layer 12 from 40–60 microns to about 10 microns or less. The exposed face of the HgCdTe body is inverted and mounted on a semiconductor circuit chip 14 by a layer 16 of an epoxy adhesive, as shown in FIG. 3 and FIG. 6.

A mask 18 of photoresistant material is applied over the cap layer 12 and includes at least one mask window opening 20 to allow ion implantation into the HgCdTe. When utilized in the formation of multiple diodes, for example of a photodetector array having multiple photodetectors, the mask 18 includes multiple window openings 20 which are appropriately patterned and mutually spaced according to the desired number of photodetector diodes of the infrared photodetector array to be fabricated.

Figure 4:
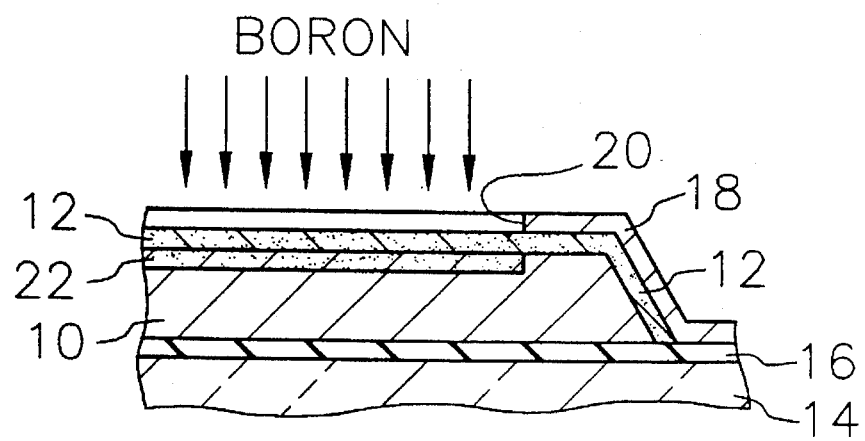
FIG. 4 is a view similar to FIG. 3 which illustrates the implantation of boron ions into a surface region of the p-type HgCdTe substrate.

Referring again to FIG. 4, an n-type region is formed in the p-type HgCdTe substrate by exposing its active surface to an ion implant beam. Implanted ions, for example, boron ions as shown in FIG. 4, travel through the cap layer 12 and type-convert the underlying HgCdTe crystal by releasing interstitial mercury, thereby defining a n-type region 22. The n-type region 22 forms a n-on-p junction directly beneath the cap layer 12 which is coincident with each mask window opening 20.

To complete the formation and electrical interconnection of the photodiode device, the mask 18 is removed and vias 24, 26 are formed through the cap layer 12 and the epoxy layer 16, respectively, for the purpose of exposing the underlying n-type region 22 and a conductive contact pad 28 embedded in the semiconductor circuit chip 14. An electrically conductive layer 30 is then formed over the cap layer 12, and also within each via 24, 26, respectively. Preferably, the conductive layer 30 is a layer of indium metal applied by evaporation/condensation.

The resulting structure provides a n-p diode which is sensitive to infrared radiation, and which is in electrical contact with the semiconductor circuit chip 14. Output signals produced by the photodiodes upon illumination by infrared radiation are thus conducted through the conductive layer 30 to the semiconductor circuit chip 14, which in one application processes the inputs received from each of the photodetectors in the photodetector array to form electrical signals corresponding to the image pattern sensed by the array.

Annealing of the substrate 10 capped by the Cd-rich CdTe cap layer 12 in a vacuum or an inert gas ambient for 15 minutes or longer (depending on temperature, typically less than 200° C.) will preset the HgCdTe surface to the metal saturated side of the phase diagram without surface degradation occurring.

A ZnS layer 32 may also be used, as shown in FIG. 5, if desired by depositing it on top of the Cd-rich cap layer 12, but is not necessary if the Cd-rich CdTe is sufficiently thick (i.e., 1000–5000 angstroms or more). In this embodiment, the low metal vacancy HgCdTe substrate 10 is grown by liquid phase epitaxy (LPE) on a substrate 34 of CdZnTe.

Cd-rich CdTe is deposited to form a cap layer 12 by evaporation or sputtering on the low metal vacancy HgCdTe substrate 10 to set the vacancy concentration to a predetermined level. HgCdTe LPE substrates 10 are capped with about 2000–5000 angstroms thick cap layer 12 of Cd-rich CdTe prior to annealing in inert gas at temperatures between about 180° C. and 440° C.

Figure 9:
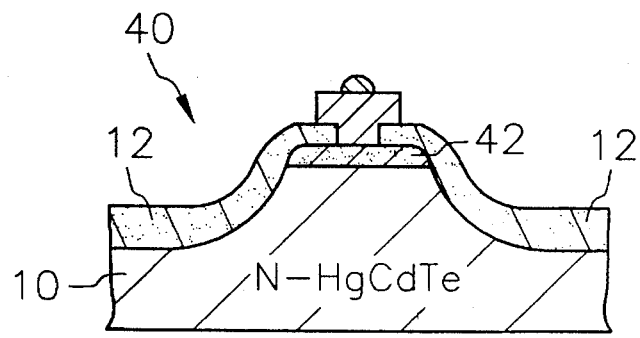
FIG. 9 is a sectional substrate view of a heterojunction diode having cadmium-rich CdTe passivation; and, FIG. 10 is a sectional substrate view of an alternative passivation embodiment.

Cd-rich CdTe passivation is also useful in the fabrication of a double layer heterojuction diode 40, as shown in FIG. 9, where a lightly doped n-type HgCdTe substrate is passivated by a cap layer 12 of cadmium-rich CdTe. A p-type layer 42 is deposited on a mesa formation of the n-type HgCdTe substrate 10. The p-type layer 42 is arsenic doped and is grown by LPE. In this example, x=0.3 for the p-type $Hg_{0.7}Cd_{0.3}Te$ layer 42. In the n-type substrate 10, x=0.22. The cadmium-rich CdTe cap layer 12 prevents type-conversion of the n-type HgCdTe substrate 10 during the annealing of the LPE grown p-type HgCdTe layer 42, while providing passivation for surface defects.

Figure 10:
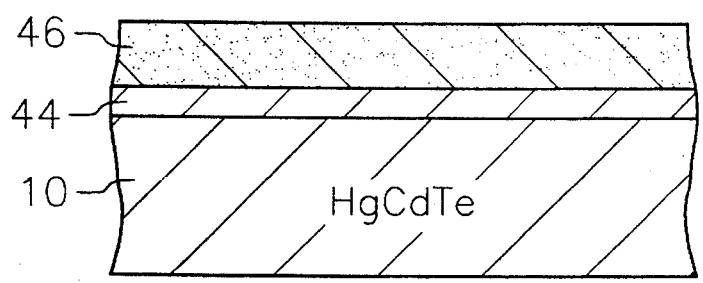

An alternative passivation embodiment is shown in FIG. 10. In this arrangement, a very thin cadmium layer 44 is deposited by evaporation or sputtering on the active surface of an HgCdTe substrate 10. Preferably, the thickness of the cadmium layer 44 is about 50 angstroms or less. A CdTe cap layer 46 is deposited by evaporation or sputtering on the cadmium layer 44. Preferably, the CdTe cap layer 46 has a thickness in the range of from about 2,000–5,000 angstroms.

The passivating effect is caused by widening of the bandgap at the active surface of the HgCdTe substrate 10, where defects may occur. This is accomplished by transferring cadmium metal atoms from the thin cadmium layer 44 into the HgCdTe substrate. The CdTe cap layer 46 is necessary because the cadmium layer 44 has a rather high vapor pressure, and would be desorbed from the surface during annealing, before the cadmium could indiffuse into the HgCdTe substrate. Consequently, by capping the Cd layer 44 with CdTe, the cadmium-richness at the active surface of the HgCdTe substrate is controlled. After the cadmium in the cadmium layer 44 is absorbed into the HgCdTe substrate 10, the bandgap is effectively widened.

Deposition of CdTe with excess Cd in it has been shown to produce low vacancy concentration n-type HgCdTe when interdiffused at 250° C. or below, and to produce high vacancy concentration p-type HgCdTe when interdiffused at 300° C. or higher, without a Hg ambient. During interdiffusion, Cd from the CdTe diffuses to the HgCdTe surface where it can either inject metal interstitials to reduce vacancies or it can react with the HgCdTe to create Hg interstitials which can then fill metal vacancies. Thus, the presence of the Cd-rich CdTe layer at the surface limits Hg loss from the HgCdTe substrate, and excess Cd in the CdTe layer prevents type-conversion of n-type HgCdTe during low temperature annealing or reduces the amount of metal vacancies formed during high temperature anneal.

Thus, Cd-rich CdTe is well suited for passivation of heterojunctions since it can prevent type-conversion of the undoped n-type layer during CdTe interdiffusion annealing. Cd-rich CdTe is also well suited for passivation of homojunctions since it increases minority carrier lifetimes (MCL) in the p-type substrate, and suppresses the Kirkendall effect by preventing migration of interfacial defects into the narrow bandgap region.

Although the present invention and its advantages have been described in detail, it should be understood that various changes, substitutions and alterations can be made herein without departing from the spirit and scope of the invention as defined by the appended claims.

What is claimed is:

1. A method for type-converting a substrate of mercury cadmium telluride from a first conductivity type to a second conductivity type comprising the steps of:

providing a substrate of mercury cadmium telluride of said first conductivity type;

capping said substrate with a layer of cadmium-rich cadmium telluride; and, annealing said capped substrate at a temperature sufficient to support interdiffusion between said cadmium-rich cadmium telluride layer and said mercury cadmium telluride substrate, wherein said cadmium-rich cadmium telluride layer induces diffusion of mercury interstitials into said substrate and lowers the metal vacancy concentration of said substrate.

2. The method of claim 1 wherein said step of providing a substrate comprises providing a substrate of p type mercury cadmium telluride.

3. The method of claim 2 wherein said annealing step is performed at 250° C. or below.

4. The method of claim 1 wherein said step of providing a substrate comprises providing a substrate of n type mercury cadmium telluride.

5. The method of claim 4 wherein said annealing step is performed at a temperature of 300° C. or higher.

6. A method for lowering the metal vacancy concentration in a substrate of mercury cadmium telluride comprising the steps of:

providing a substrate of mercury cadmium telluride;

capping said substrate with a layer of cadmium-rich cadmium telluride; and, annealing said capped substrate at a temperature sufficient to support interdiffusion between said cadmium rich cadmium telluride layer and said mercury cadmium telluride substrate, wherein said cadmium-rich cadmium telluride layer induces diffusion of mercury interstitials into said substrate.

7. The method as defined in claim 6, wherein said cadmium-rich cadmiun telluride is characterized by the presence of excess cadmium in the range of from about 0.001 to about 50 percent.

8. The method as defined in claim 6, wherein said mercury cadmium telluride substrate comprises an alloy having the formula $Hg_{1-x}Cd_xTe$ where x is a positive number less than one.

9. The method as defined in claim 6, wherein said annealing step is performed at a temperature in the range of from about 180° C to about 450° C.

10. The method as defined in claim 6, wherein said annealing step is performed from about 30 minutes to about 10 days.

11. A method for widening the band gap at a mercury cadmium telluride surface, comprising the steps of:

providing a substrate of mercury cadmium telluride;

capping said substrate with a layer of cadmium-rich cadmium telluride; and, annealing said capped substrate at a temperature sufficient to support interdiffusion between said cadmium rich cadmium telluride layer and said mercury cadmium telluride substrate, wherein said cadmium-rich cadmium telluride layer induces diffusion of mercury interstitials into said substrate and lowers the metal vacancy concentration of said substrate.

12. The method as defined in claim 11 wherein said cadmium-rich cadmium telluride is characterized by the presence of excess cadmium in the range of from about 0.001 to about 50 percent.

13. The method as defined in claim 11 wherein said mercury cadmium telluride substrate is made of an alloy having the formula $Hg_{1-x}Cd_xTe$ where x is a positive number less than one.

14. The method as defined in claim 11 wherein said annealing step is performed at a temperature in the range of from about 180° C. to about 450° C.

15. The method as defined in claim 11 wherein said annealing step is performed from about 30 minutes to about 10 days.

\* \* \* \* \*